United States Patent
Bloom et al.

(10) Patent No.: US 6,228,779 B1
(45) Date of Patent: May 8, 2001

(54) ULTRA THIN OXYNITRIDE AND NITRIDE/ OXIDE STACKED GATE DIELECTRICS FABRICATED BY HIGH PRESSURE TECHNOLOGY

(75) Inventors: John A. Bloom, Bullard; Dim-Lee Kwong, Austin, both of TX (US); Robert K. Evans, San Jose; Bruce T. Acker, Sunnyvale, both of CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 09/187,247

(22) Filed: Nov. 6, 1998

(51) Int. Cl.[7] .................................................. H01L 21/31
(52) U.S. Cl. .............................................. 438/763; 438/763
(58) Field of Search ...................................... 438/199, 201, 438/203, 257, 715, 723, 724, 755, 756, 757, 434, 561, 392, 923, 301

(56) References Cited

U.S. PATENT DOCUMENTS

| 4,053,335 | * | 10/1977 | Hu ........................................ 148/174 |
| 4,241,359 | | 12/1980 | Izumi et al. . | |
| 4,523,213 | | 6/1985 | Konaka et al. . | |
| 4,571,609 | | 2/1986 | Hatano . | |
| 4,676,847 | * | 6/1987 | Lin ........................................ 148/188 |
| 4,862,232 | | 8/1989 | Lee . | |
| 4,980,307 | | 12/1990 | Ito et al. .............................. 437/40 |
| 5,028,557 | * | 7/1991 | Tsai et al. ............................ 437/59 |
| 5,071,780 | * | 12/1991 | Tsai ..................................... 437/41 |
| 5,397,720 | * | 3/1995 | Kwong et al. ...................... 438/301 |
| 5,578,848 | | 11/1996 | Kwong et al. . | |
| 5,674,788 | | 10/1997 | Wristers et al. ................... 437/239 |
| 5,693,975 | | 12/1997 | Lien . | |

* cited by examiner

Primary Examiner—David Nelms
Assistant Examiner—David Nhu
(74) Attorney, Agent, or Firm—Roland Tso

(57) ABSTRACT

A dense and stable dielectric layer of silicon nitride and silicon dioxide suitable for use in transistors of ULSI circuits is fabricated by a high pressure process in which a nitride layer is first formed on a surface of a silicon substrate and then a silicon dioxide layer is formed on the silicon surface under the nitride layer. By placing the nitride layer above the silicon dioxide and next to a doped polysilicon gate, diffusion of dopant ions such as boron from the gate into the silicon dioxide is reduced. As semiconductor devices are scaled down, the thermal budget required for the process steps is reduced.

11 Claims, 1 Drawing Sheet

ULTRA THIN OXYNITRIDE AND NITRIDE/OXIDE STACKED GATE DIELECTRICS FABRICATED BY HIGH PRESSURE TECHNOLOGY

BACKGROUND OF THE INVENTION

This invention relates generally to semiconductor processing technology and more particularly the invention relates to dielectrics used in submicron devices and ULSI microelectronic circuits.

The metal-insulator-silicon (MIS) transistor including the metal-oxide-silicon (MOS) transistor is used in large scale integrated (LSI), very large scale integrated (VLSI), and ultra large scale integrated (ULSI) microelectronic circuits. The transistor has a current carrier source region formed in a surface of a semiconductor (e.g., silicon) body, a carrier drain region formed in the surface and spaced from the source, and between the source and drain is a channel region through which the current carriers flow. Overlying the channel region and aligned with edges of the source and drain is a gate electrode which is physically and electrically separated from the channel by a dielectric layer. Typically, the dielectric layer comprises a silicon dioxide ($SiO_2$) and the gate comprises a doped polysilicon material.

To prevent migration of dopants such as boron into the silicon dioxide gate dielectric layer from the silicon substrate and from the doped polysilicon gate, nitride ions have been placed in the silicon oxide layer by ion implantation and by $NH_3$ (anhydrous ammonia) nitridation. U.S. Pat. No. 5,397,720 discloses a method of making a MOS transistor having an improved oxynitride dielectric in which high quality ultra thin gate oxides have nitrogen ions therein with a profile having a peak at the silicon oxide-silicon interface. U.S. Pat. No. 5,578,848 discloses a low pressure rapid-thermal reoxidation of silicon nitride films with a rapid thermal reoxidation being carried out in $N_2O$ or in $O_2$ ambient.

Typical high thermal-budget oxynitridation processes, such as with $N_2O$ or NO result in nitrogen incorporation at the silicon dioxide/silicon interface in relatively small amounts. Increasing nitrogen concentration improves reliability and the ability of the dielectric layer to suppress boron penetration, but increases fixed-charge and interface-trap density. This, in turn, degrades device performance by reducing the peak channel mobility and degrading transconductance of the MOS device. Furthermore, boron penetration into the silicon oxide with a diffusion barrier situated at the silicon dioxide-silicon interface can degrade the oxide reliability due to boron accumulation in the oxide. Ideally, therefore, it is desirable to have the nitrogen-rich layer located at the polysilicon/dielectric interface for an effective barrier to suppress boron diffusion from the gate without affecting the channel carrier mobility.

Heretofore, plasma nitridation has been used in the formation of 4 nm gate dielectric films with nitrogen at the top (gate electrode/dielectric) interface. The process consists of nitriding a previously formed thermal oxide with a remote, high density helicon-based nitrogen discharge at room-temperature for short durations on the order of a few seconds, followed by a high temperature post-nitridation anneal. Nitridation was performed at room-temperature by exposing the gate oxide to a short, high-density, remote helicon-based nitrogen discharge.

SUMMARY OF THE INVENTION

In accordance with the present invention, ultra thin MOS gate dielectric films having nitrogen located away from the silicon dioxide/silicon interface are fabricated using an oxygen reoxidation of nitrided silicon substrates.

Both the nitridation of silicon in a NO or a $NH_3$ ambient, for example, and the reoxidation of the nitrided silicon in $N_2O$ or $O_2$ are carried out at high pressure, (i.e., greater than 1 atm). Both process steps can be carried out in-situ.

The process in accordance with the invention has a number of advantages including a low thermal budget requirement. The processing temperature for oxygen reoxidation can be significantly lower using high pressure, thus allowing fabrication of ultra compact and ultra small devices.

The nitridation process is a self limited growth process since the incorporation of a significant amount of nitrogen during nitridation acts as a diffusion barrier and limits the growth process. Therefore, the control over a very thin nitride growth is facilitated.

The oxygen reoxidation at high pressure allows slow diffusion of oxygen through the nitride layer without consuming the nitride layer, resulting in an oxidation of the underlying silicon substrate and forming a high quality silicon dioxide layer between the nitride layer and the silicon substrate. Device performance is thus enhanced since mobility and transconductance are higher for a silicon dioxide/silicon interface without the presence of nitrogen atoms. The resulting structure is a nitride/oxide stacked layer.

By first forming the nitride layer and then forming the underlying ultra thin silicon dioxide layer, process control is enhanced over prior art processes in which the silicon dioxide layer is first formed, followed by either chemical vapor deposition of nitride or the nitridation of the silicon oxide surface. Further, the thermally grown films at high pressures are shown to have improved quality and density and stability as compared to chemical vapor deposited or plasma processing.

The invention and objects and features thereof will be more fully understood from the following detailed description and appended claims taken with the drawings.

DETAILED DESCRIPTION OF ILLUSTRATIVE EMBODIMENT

Figure 1:
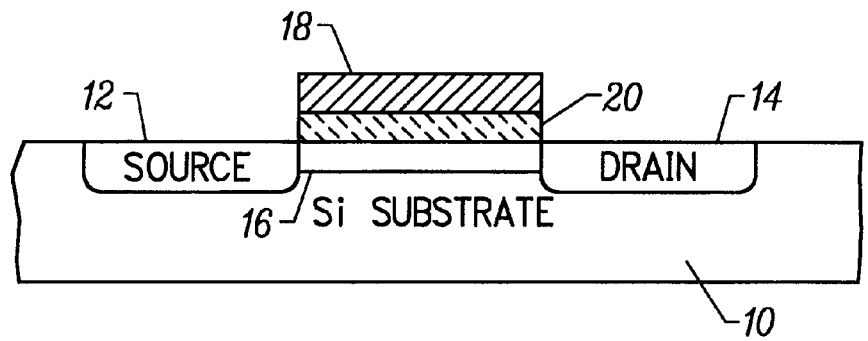
FIG. 1 is a section view of an MOS transistor including a dielectric in accordance with the invention.

Referring now to the drawing, FIG. 1 is a section view of a MOSFET transistor including a dielectric in accordance with the invention. The transistor is formed in a silicon substrate 10 with a carrier source region 12 and the carrier drain region 14 formed in a major surface of the substrate. The source and drain are separated by a channel region 16 through which current carriers flow. Control of the conduction of the carriers through the channel 16 is achieved by voltage biasing a gate electrode 18 spaced above the channel region in alignment with edges of the source and drain and separated from the substrate by a dielectric 20. In an enhancement mode transistor, the channel 16 is non-conducting until a voltage bias is applied to induce a conductive channel under the dielectric, while in a depletion mode transistor the channel region is conducting until a voltage bias is applied to deplete current carriers in the channel region under the dielectric.

In accordance with the invention, the dielectric layer 18 comprises an ultra thin (i.e., as thin as a monolayer growth) silicon dioxide layer on the substrate surface underlying a silicon nitride layer. The gate 18 is formed on the silicon nitride layer.

Figure 2:
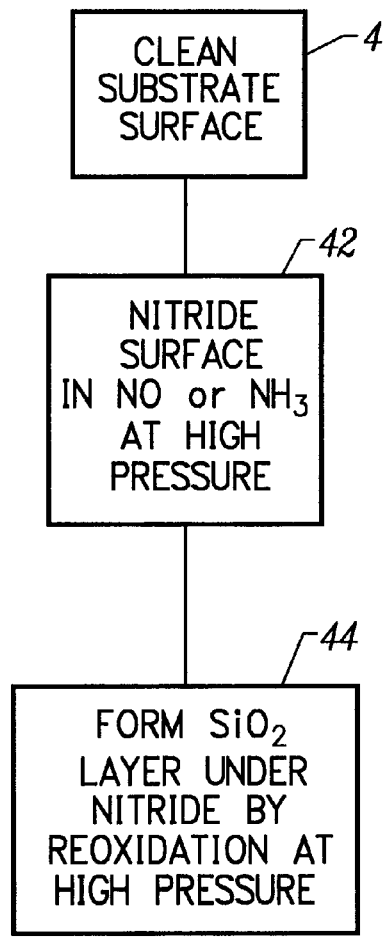
FIG. 2 is a flow diagram of a process of forming a dielectric in the device of FIG. 1 in accordance with an embodiment of the invention

FIG. 2 illustrates steps in a process of forming the dielectric layer in the transistor of FIG. 1 in accordance with one embodiment of the invention. The surface of a silicon substrate on which the dielectric is to be grown is initially cleaned using a conventional RCA wet chemical process as shown at 40. Next, the cleaned surface is nitrided in an atmosphere of nitric oxide (NO) or ammonia ($NH_3$) at a high pressure (e.g., greater than 1 atm and up to 30 atm). The device and nitrogen atmosphere are heated to 600–900° C. for a time period between 5 and 20 minutes as shown at 42 to produce a silicon nitride layer of 5–20 Å. The nitridation process is a self-limited growth process since the incorporation of a significant amount of nitrogen during nitridation acts as a diffusion barrier thus limiting the growth process. Therefore, the control over a very thin nitride growth is excellent.

Thereafter, as shown at 44 an oxygen atmosphere of $N_2O$ or $O_2$ is introduced at a high pressure (i.e., greater than 1 atm and up to 30 atm) and the device and oxygen atmosphere are again heated to 600–900° C. for 10–60 minutes. The oxygen atoms slowly diffuse through the nitride layer without consuming the nitride layer, resulting in an oxidation of the underlying silicon substrate and forming a high quality silicon dioxide layer between the nitride layer and the silicon substrate of one or more monolayers. This is desirable from the device performance point of view since mobility and transconductance are higher for silicon oxide/silicon interface without nitrogen atoms being present. The final structure is a nitride/oxide stacked layer between the gate and the underlying silicon substrate. The thickness of the bottom silicon dioxide layer is determined by the nitridation condition (temperature, time, ambient pressure) as well as the reoxidation condition (temperature, time, ambient pressure). Process control over the ultra thin silicon dioxide layer growth is excellent due to the slow diffusion of oxidant through the nitride layer. As a result a monolayer growth underlying the nitride layer can be achieved. This is extremely attractive from the manufacturing point of view since process control and repeatability are the most important considerations for growing ultra thin dielectric films.

Unlike other reported processes for nitride/oxide stacked layers, the process in accordance with the invention forms the nitride first and then is followed by the formation of the ultra thin bottom silicon dioxide layer. Other prior art processes form a thermally grown silicon oxide layer followed by either chemical vapor deposition nitride or nitridation of the silicon dioxide surface. In both cases, the growth of the initial ultra thin silicon dioxide layer as well as the formation of the top ultra thin nitride layer are very difficult to control. The resulting thermally grown films at high pressures are higher quality when compared to films formed by CVD or plasma processing with the high pressure grown films being denser and more stable.

By using a high pressure atmosphere in accordance with the invention, the processing temperatures for the oxygen reoxidation can be significantly lower than in prior art processes, thus allowing fabrication of ultra compact and ultra small devices.

While the invention has been described with reference to a preferred embodiment, the description is illustrative of the invention and is not to be construed as limiting the invention. Various modifications and applications may occur to those skilled in the art without departing from the true spirit and scope of the invention as defined by the appended claims.

What is claimed is:

1. A method of fabricating an MIS transistor comprising the steps of:

a) providing a monocrystalline silicon substrate having a major surface, b) cleaning said major surface, c) placing the substrate in an atmosphere of a nitrogen compound at a pressure above one atmosphere, d) heating the substrate and forming a nitride layer on said major surface, e) placing the substrate and nitride layer in an atmosphere including oxygen ($N_2O$ or $O_2$) at a pressure above one atmosphere, f) heating the substrate and forming a silicon dioxide layer on said major surface under the nitride layer, g) forming a gate electrode on the nitride layer, and h) forming a source region and a drain region in the substrate abutting the major surface and aligned with the gate electrode.

2. The method as defined by claim 1 wherein step c) includes a nitrogen compound selected from the group consisting of nitric oxide (NO) and ammonia ($NH_3$).

3. The method as defined by claim 1 wherein step d) includes heating the substrate at a temperature in the range of 600–900° C. for a period of time in the range of 5–20 minutes.

4. The method as defined by claim 1 wherein step f) includes heating the substrate at a temperature in the range of 600–900° C. for a period of time in the range of 10–60 minutes.

5. The method as defined by claim 1 wherein step g) includes forming a layer of doped polysilicon on the nitride layer and etching the layer of polysilicon, nitride layer, and the silicon dioxide layer to form the gate electrode.

6. The method as defined by claim 1 wherein step c) includes a nitrogen compound selected from the group consisting of nitric oxide (NO) and ammonia ($NH_3$), step d) includes heating the substrate at a temperature in the range of 600–900° C. for a period of time in the range of 5–20 minutes, and step f) includes heating the substrate at a temperature in the range of 600–900° C. for a period of time in the range of 10–60 minutes.

7. A method of fabricating a dielectric layer on a surface of a silicon substrate including a silicon dioxide layer between a nitride layer and the substrate surface, said method comprising the steps of a) cleaning said surface, b) placing the substrate in an atmosphere of a nitrogen compound at a pressure above one atmosphere, c) heating the substrate and forming a nitride layer on said major surface, d) placing the substrate and nitride layer in an atmosphere including oxygen at a pressure above one atmosphere, e) heating the substrate and forming a silicon dioxide layer on said surface under the nitride layer.

8. The method as defined in claim 7 wherein step b) includes a nitrogen compound selected from the group consisting of nitrous oxide (NO) and ammonia ($NH_3$).

9. The method as defined in claim 7 wherein step c) includes heating the substrate at a temperature in the range of 600–900° C. for a period of time in the range of 5–20 minutes.

10. The method as defined in claim 7 wherein step d) includes heating the substrate at a temperature in the range of 600–900° C. for a time in the range of 10–60 minutes.

11. The method as defined in claim 7 wherein step b) includes a nitrogen compound selected from the group consisting of nitric oxide (NO) and ammonia ($NH_3$), step c) includes heating the substrate at a temperature in the range of 600–900° C. for a period of time in the range of 5–20 minutes, and step e) includes heating the substrate at a temperature in the range of 600–900° C. for a time in the range of 10–60 minutes.

* * * * *